United States Patent
Chen et al.

(10) Patent No.: US 7,715,196 B2
(45) Date of Patent: May 11, 2010

(54) MOUNTING DEVICE FOR CHIPS

(75) Inventors: Jung-Fa Chen, Taipei Hsien (TW); Chu-Cheng Tsai, Taipei Hsien (TW)

(73) Assignee: Acbel Polytech Inc., Taipei Hsien (TW)

( * ) Notice: Subject to any disclaimer, the term of this patent is extended or adjusted under 35 U.S.C. 154(b) by 0 days.

(21) Appl. No.: 12/055,306

(22) Filed: Mar. 25, 2008

(65) Prior Publication Data
US 2009/0244847 A1    Oct. 1, 2009

(51) Int. Cl.
*H05K 7/20*    (2006.01)
*F28F 7/00*    (2006.01)
*H01L 23/34*    (2006.01)

(52) U.S. Cl. .............. 361/719; 165/80.2; 165/185; 257/719; 361/704; 361/710

(58) Field of Classification Search .......... 257/718–719; 361/688–690
See application file for complete search history.

(56) References Cited

U.S. PATENT DOCUMENTS

| | | | | |
|---|---|---|---|---|
| 4,563,725 A | * | 1/1986 | Kirby | 361/708 |
| 4,674,005 A | * | 6/1987 | Lacz | 361/708 |
| 4,972,294 A | * | 11/1990 | Moses et al. | 361/704 |
| 5,130,888 A | | 7/1992 | Moore | |
| 5,274,193 A | * | 12/1993 | Bailey et al. | 174/16.3 |
| 5,327,324 A | * | 7/1994 | Roth | 361/707 |
| 5,450,284 A | * | 9/1995 | Wekell | 361/710 |
| 6,043,981 A | * | 3/2000 | Markow et al. | 361/704 |
| 6,144,092 A | * | 11/2000 | Kappes et al. | 257/718 |
| 6,266,244 B1 | * | 7/2001 | Guthrie | 361/704 |
| 7,542,294 B2 | * | 6/2009 | Caines et al. | 361/704 |

FOREIGN PATENT DOCUMENTS

CN    2275284 Y    2/1998

* cited by examiner

*Primary Examiner*—Gregory D Thompson
(74) *Attorney, Agent, or Firm*—Pai Patent & Trademark Law Firm; Chao-Chang David Pai

(57) ABSTRACT

A mounting device for chips has a heat sink and at least one clamp. The heat sink has at least one conductive side, two ends, multiple chip units and two connecting bases. The chip units are arranged on the at least one conductive side. The connecting bases are formed on the ends of the heat sink. The at least one clamp is mounted across the at least one conductive side of the heat sink and has two ends, a middle sheet, multiple pressing tabs and two connecting arms. The pressing tabs extend from the middle sheet to press the chip units against the conductive side of the heat sink. The connecting arms are formed respectively on the ends of the clamp and are mounted respectively on the connecting bases.

15 Claims, 9 Drawing Sheets

MOUNTING DEVICE FOR CHIPS

BACKGROUND OF THE INVENTION

1. Field of the Invention

The present invention relates to a mounting device, and more particularly to a mounting device for chips, which incorporates a heat sink on which the chips are mounted.

2. Description of the Prior Arts

In the electronics industry, heat sinks are generally used on electronic components to dissipate heat generated by processing units. Many kinds of conventional mounting devices are used to mount chips on a heat sink.

With reference to FIG. 13, a conventional mounting device for a chip in accordance with the prior art comprises a chip unit (71), an insulated gasket (72), a heat sink (73) and a fastener (74). The chip unit (71) comprises a chip and a mounting tab. The chip has a rear surface. The mounting tab is attached to and protrudes up from the rear surface of the chip and has an upper end, a rear surface and a mounting hole (711). The mounting hole (711) is formed through the mounting tab near the upper end. The insulated gasket (72) is mounted against the rear surface of the mounting tab and has a mounting hole (721) and a rear surface. The mounting hole (721) is formed through the insulated gasket (72) and corresponds to and aligns with the mounting hole (711) in the mounting tab. The heat sink (73) is mounted against the rear surface of the insulated gasket (72) and has a mounting hole (731). The mounting hole (731) is formed through the heat sink (73) and corresponds to and aligns with the mounting hole (721) in the insulated gasket (72). The fastener (74) is mounted through the mounting holes (711, 721, 731), connects the chip unit (71), the insulated gasket (72) and the heat sink (73) together and comprises a collar (742), a bolt (741), multiple washers (743) and a nut (744). The collar (742) is mounted through the mounting holes (711, 721, 731). The bolt (741) is mounted through the collar (742). The washers (743) are mounted around the bolt (741) against the collar (742) and the heat sink (73). The nut (744) screws onto the bolt (741) to hold the chip unit (71), the insulated gasket (72) and the heat sink (73) together. However, assembling the conventional mounting device takes a lot of time because components of the fastener (74) are small and tedious to install and connect. Moreover, the conventional mounting device is unsteady when used with high voltage. Because the chip unit (71) is so close to the bolt (741), voltage differential between the chip unit (71) and the bolt (741) is too high and may cause insulation breakdown or a flashover that will damage the chip unit (71).

With reference to FIG. 14, another conventional mounting device in accordance with the prior art mounts multiple chip units (71A) on a heat sink (73A) and comprises multiple insulated covers (76), a brace (78) and multiple bolts (75). The insulated covers (76) are resilient and are mounted respectively on the chip units (71A). The brace (78) may be a flat bar, is connected to the heat sink (73A), is mounted against the chip units (71A) and holds the chip units (71A) against the heat sink (73A). This mounting device also takes a lot of time to assemble because the insulated covers (76) must be mounted on the chip units (71A) to prevent the chip units (71A) from being pressed with unequal pressures by the brace (78).

With reference to FIG. 15, another conventional mounting device in accordance with the prior art to mount a chip unit (71B) on a heat sink (73B) is a clamping device (77). The clamping device (77) has two ends, a protruding segment and a resilient clamp (771). The two ends are attached securely to the heat sink (73B). The protruding segment is U-shaped and holds a chip unit (71B) against the heat sink (73B). The resilient clamp (771) is an L-shaped tab, is formed on the protruding segment of the clamping device (77) and presses the chip unit (71B) against the heat sink (73B). This kind of mounting device is inconvenient and expensive to use in large volume applications because each clamping device (77) holds only one chip unit (71B).

To overcome the shortcomings, the present invention provides a mounting device to mitigate or obviate the aforementioned problems.

SUMMARY OF THE INVENTION

The primary objective of the present invention is to provide a mounting device for chips, which incorporates a heat sink and mounts multiple chips on the heat sink.

A mounting device for chips has a heat sink and at least one clamp. The heat sink has at least one conductive side, two ends, multiple chip units and two connecting bases. The chip units are arranged on the at least one conductive side. The connecting bases are formed on the ends of the heat sink. The at least one clamp is mounted across the at least one conductive side of the heat sink and has two ends, a middle sheet, multiple pressing tabs and two connecting arms. The pressing tabs extend from the middle sheet to press the chip units against the conductive side of the heat sink. The connecting arms are formed respectively on the ends of the clamp and are mounted respectively on the connecting bases. Consequently, the mounting device for chips provides a cheap and easy way to mount the chips on the conductive side of the heat sink at the same time.

Other objectives, advantages and novel features of the invention will become more apparent from the following detailed description when taken in conjunction with the accompanying drawings.

DETAILED DESCRIPTION OF THE PREFERRED EMBODIMENTS

With reference to FIGS. 1, 4 and 6 to 12, a mounting device for chips in accordance with the present comprises a heat sink (10, 10A, 10B, 10C, 10D, 10E, 10F) and at least one clamp (40, 40A, 40B, 40C, 40D, 40E, 40F).

Figure 1:
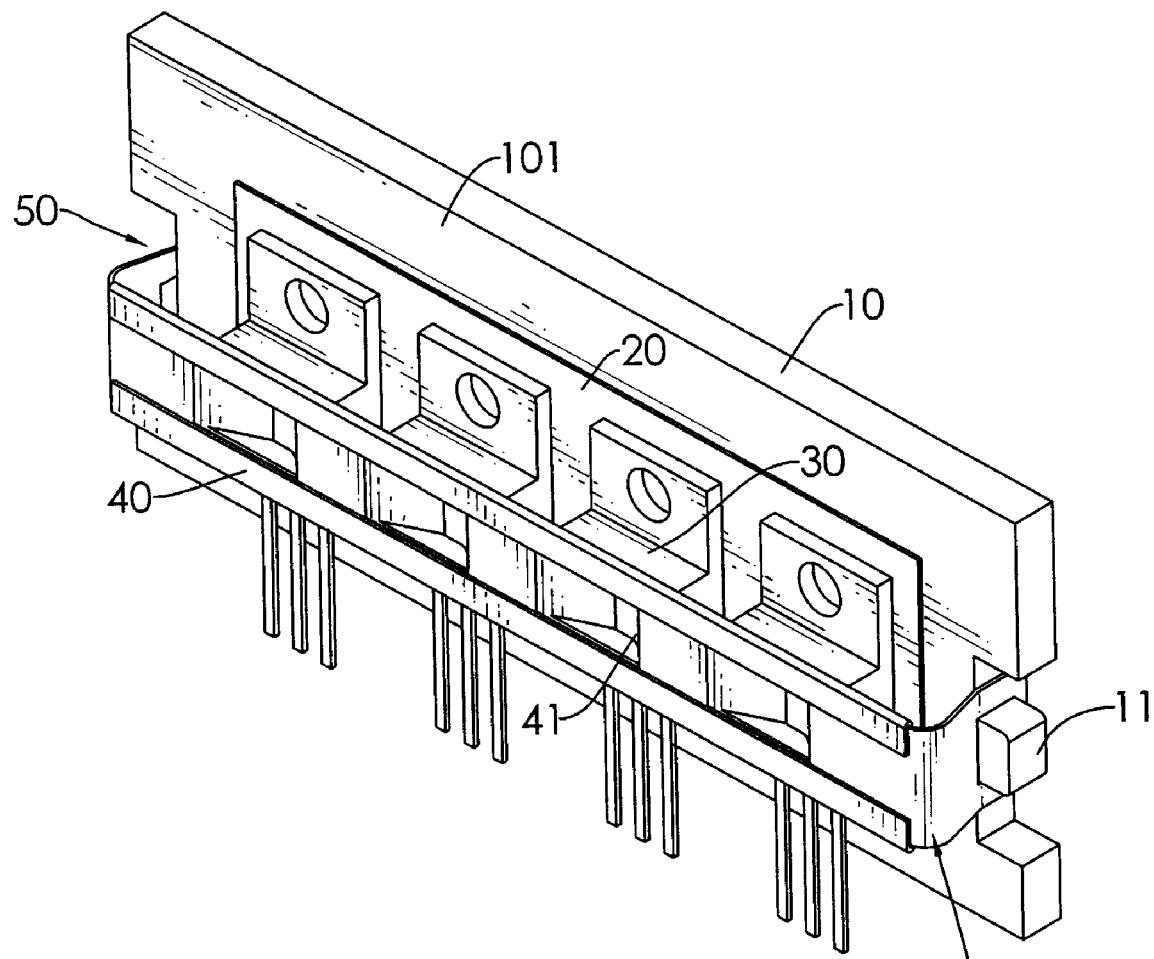
FIG. 1 is a perspective view of a first embodiment of a mounting device for chips in accordance with the present invention.
Figure 2:
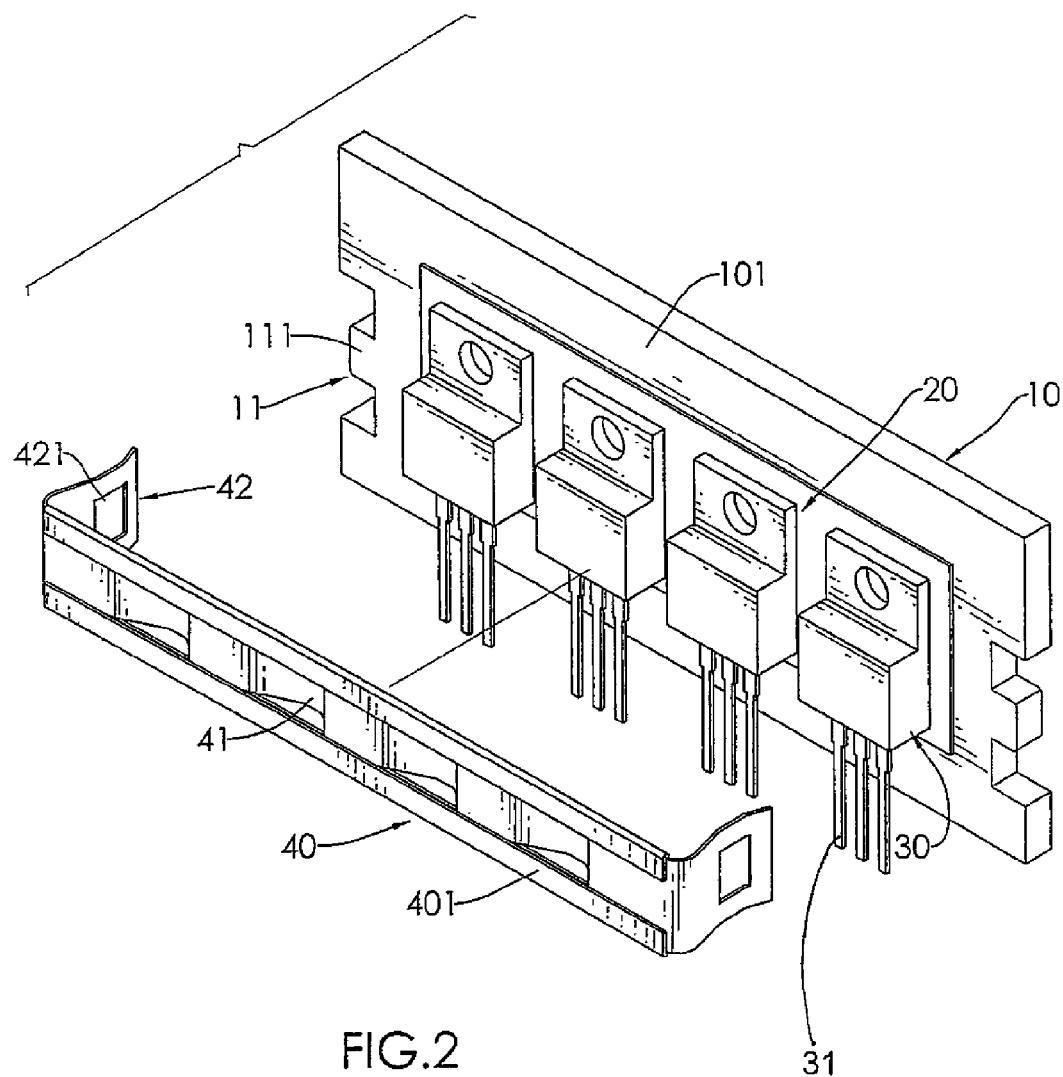
FIG. 2 is an exploded perspective view of the mounting device in FIG. 1.

With further reference to FIG. 2, the heat sink (10, 10A, 10B, 10C, 10D, 10E, 10F) is a flat board, has at least one conductive side (101), two ends, at least one optional insulation spacer (20), multiple chip units (30), and two connecting bases (11, 11A, 11B, 11C, 11D, 11E, 11F).

The at least one insulation spacer (20) is attached to the at least one conductive side (101).

The chip units (30) are arranged longitudinally in a row and are attached on the at least one insulation spacer (20). Each chip unit (30) has multiple leads (31) extending transversely.

The connecting bases (11, 11A, 11B, 11C, 11D, 11E, 11F) are formed respectively on the ends of the heat sink (10, 10A, 10B, 10C, 10D, 10B, 10F). Each connecting base (11, 11A, 11B, 11C, 11D, 11E, 11F) has at least one connecting tab (111, 111E), a connecting hole (112A, 112B, 112F), at least one connecting hook (113C) or at least one connecting protrusion (114D).

The at least one connecting tab (111, 111E) extends longitudinally from the corresponding end of the heat sink (10). When the heat sink (10E) has two conductive sides (101E), two connecting tabs (111E) respectively extend longitudinally from the ends of the heat sink (10E) on the conductive sides (101E) and respectively flush with the conductive sides (101E).

The connecting hole (112A, 112B, 112F) is formed transversely through the corresponding end of the heat sink (10A, 10B, 10F).

The at least one connecting hook (113C) is formed transversely on the at least one conductive side (101) near the corresponding end of the heat sink (10C).

The at least one connecting protrusion (114D) extends transversely from the at least one conductive side (101) adjacent to the corresponding end of the heat sink (10D) and each connecting protrusion (114D) has an inserting hole (115D). The inserting hole (115D) is formed longitudinally through the at least one protrusion (114D).

Figure 3:
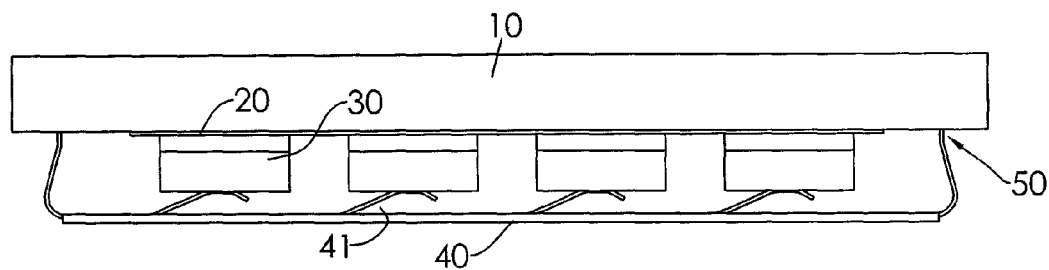
FIG. 3 is a top view of the mounting device in FIG. 1.
Figure 4:
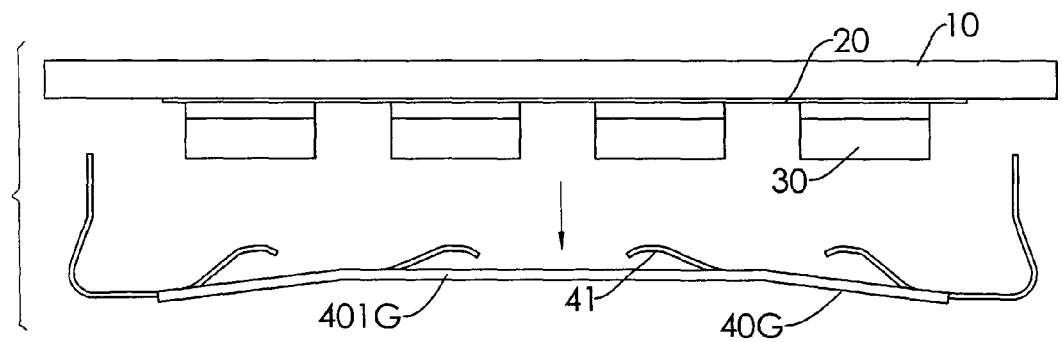
FIG. 4 is an exploded top view of a second embodiment of a mounting device for chips in accordance with the present invention.
Figure 5:
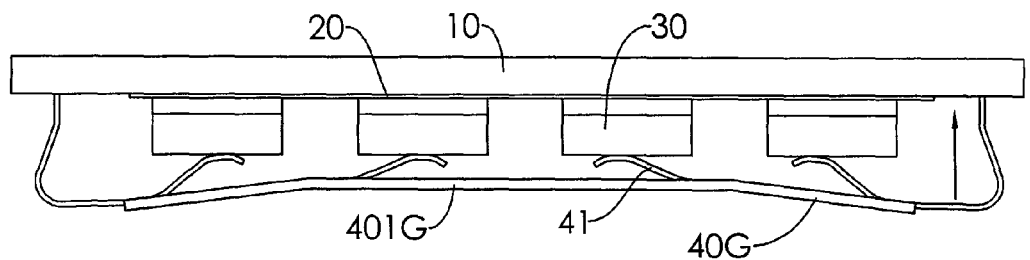
FIG. 5 is an operational top view of the mounting device in FIG. 4.
Figure 6:
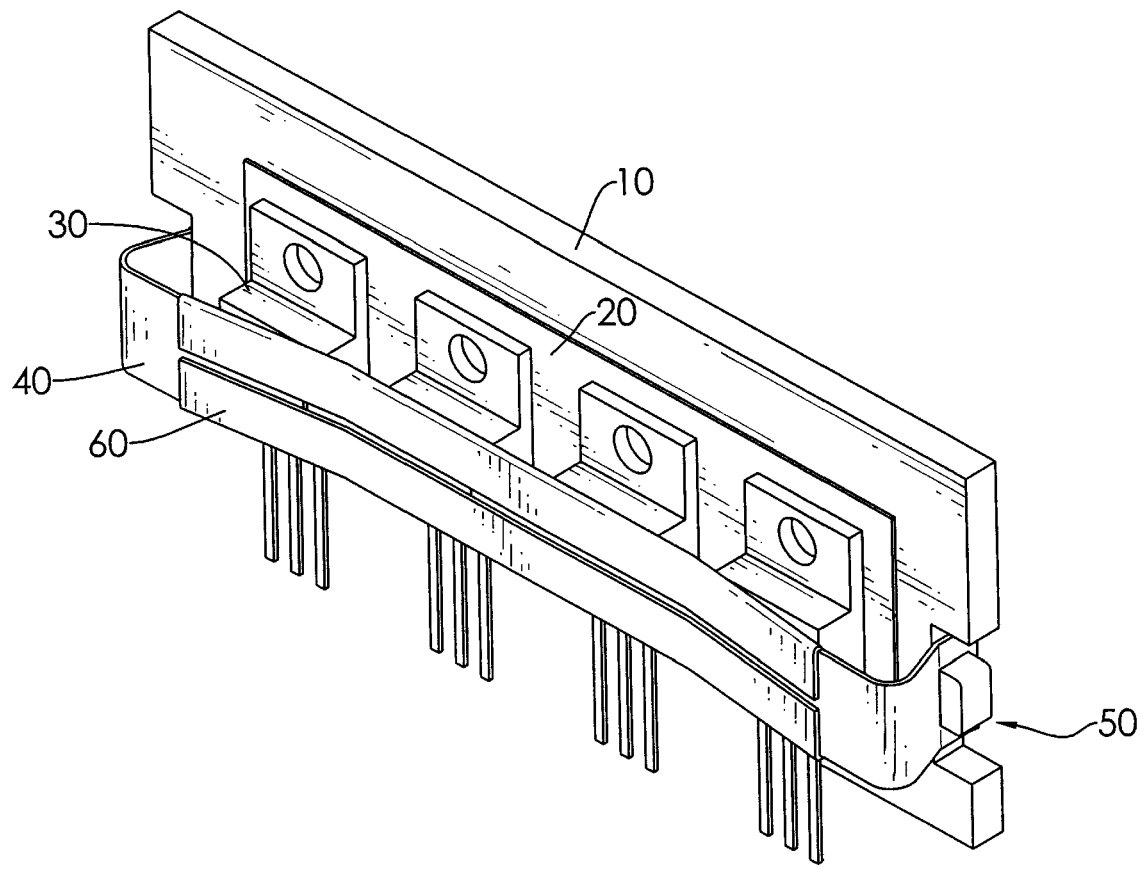
FIG. 6 is a perspective view of a third embodiment a mounting device for chips in accordance with the present invention.
Figure 7:
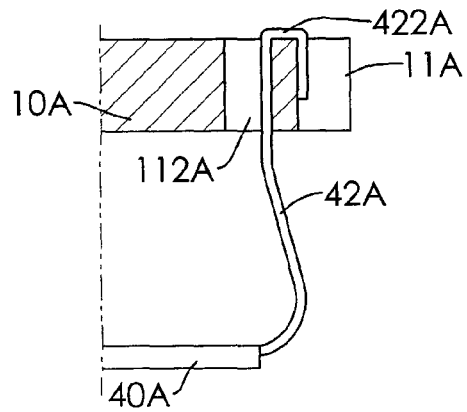
FIG. 7 is an enlarged top view in partial section of a fourth embodiment of a mounting device for chips in accordance with the present invention.
Figure 8:
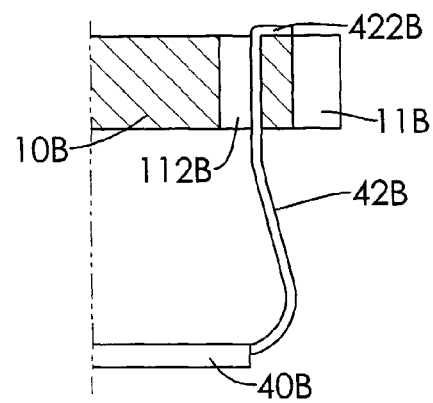
FIG. 8 is an enlarged top view in partial section of a fifth embodiment of a mounting device for chips in accordance with the present invention.
Figure 9:
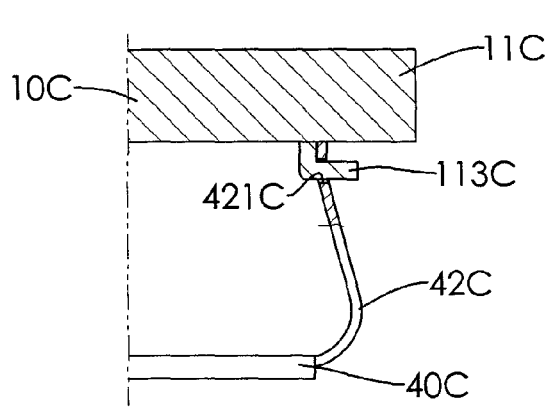
FIG. 9 is an enlarged top view in partial section of a sixth embodiment of a mounting device for chips in accordance with the present invention.
Figure 10:
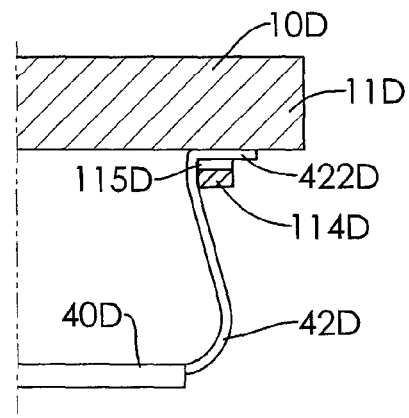
FIG. 10 is an enlarged top view in partial section of a seventh embodiment of a mounting device for chips in accordance with the present invention.
Figure 12:
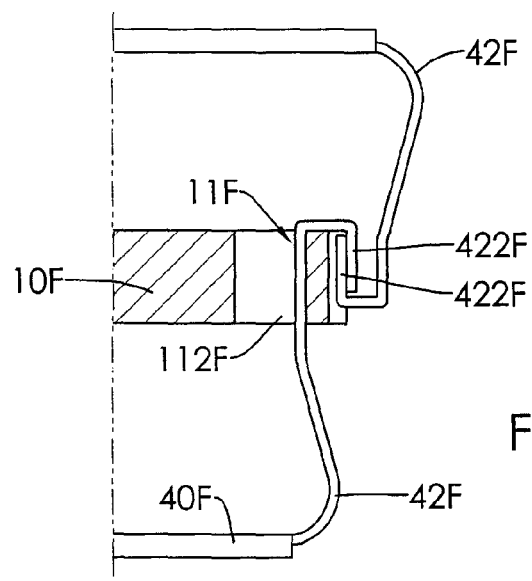
FIG. 12 is an enlarged top view of a ninth embodiment of a mounting device in accordance with the present invention.
Figure 11:
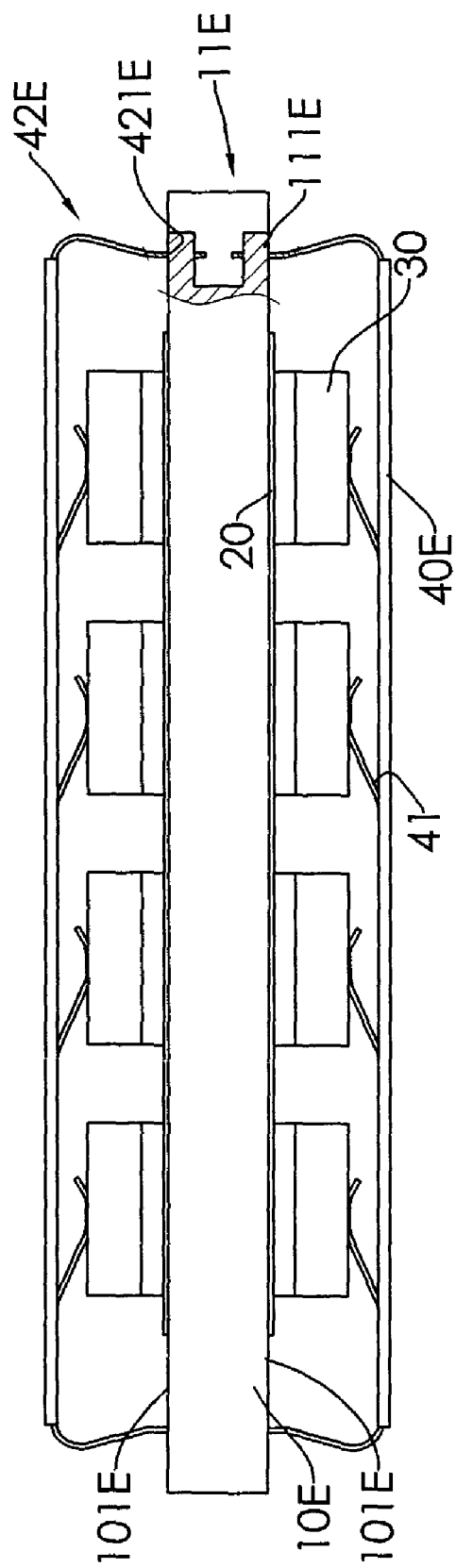
FIG. 11 is a top view of an eighth embodiment of a mounting device for chips in accordance with the present invention.
Figure 13:
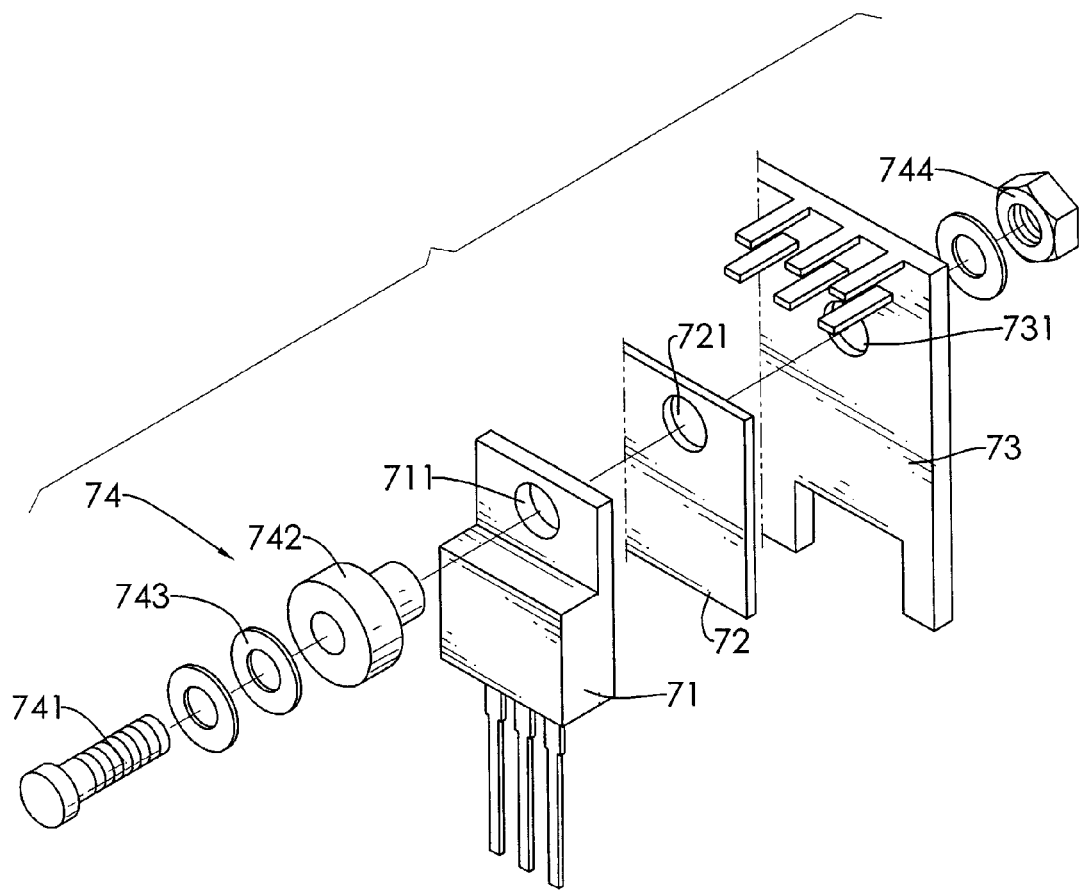
FIG. 13 is an exploded perspective view of a conventional mounting device in accordance with the prior art.
Figure 14:
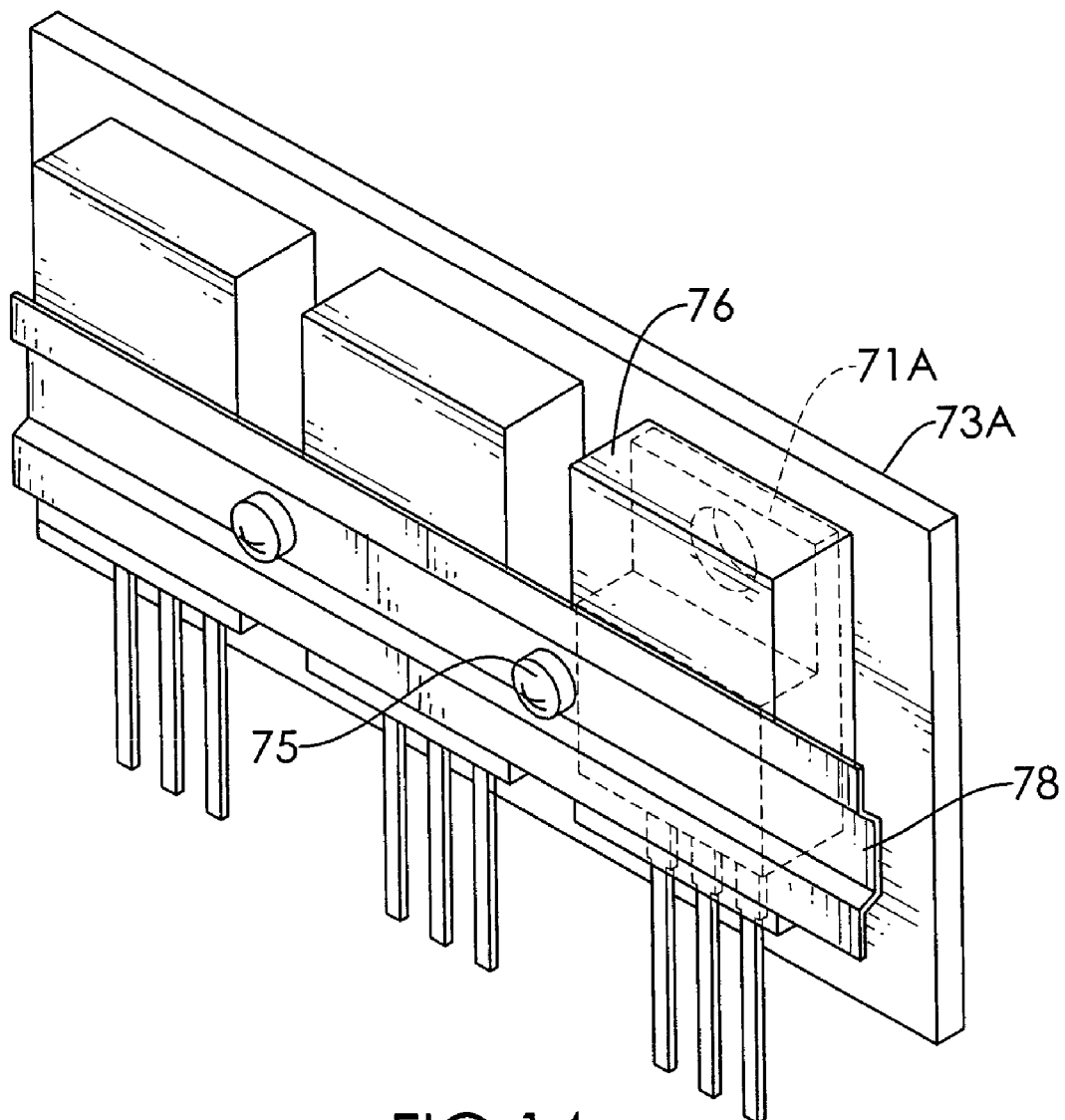
FIG. 14 is a perspective view of a conventional mounting device in accordance with the prior art.
Figure 15:
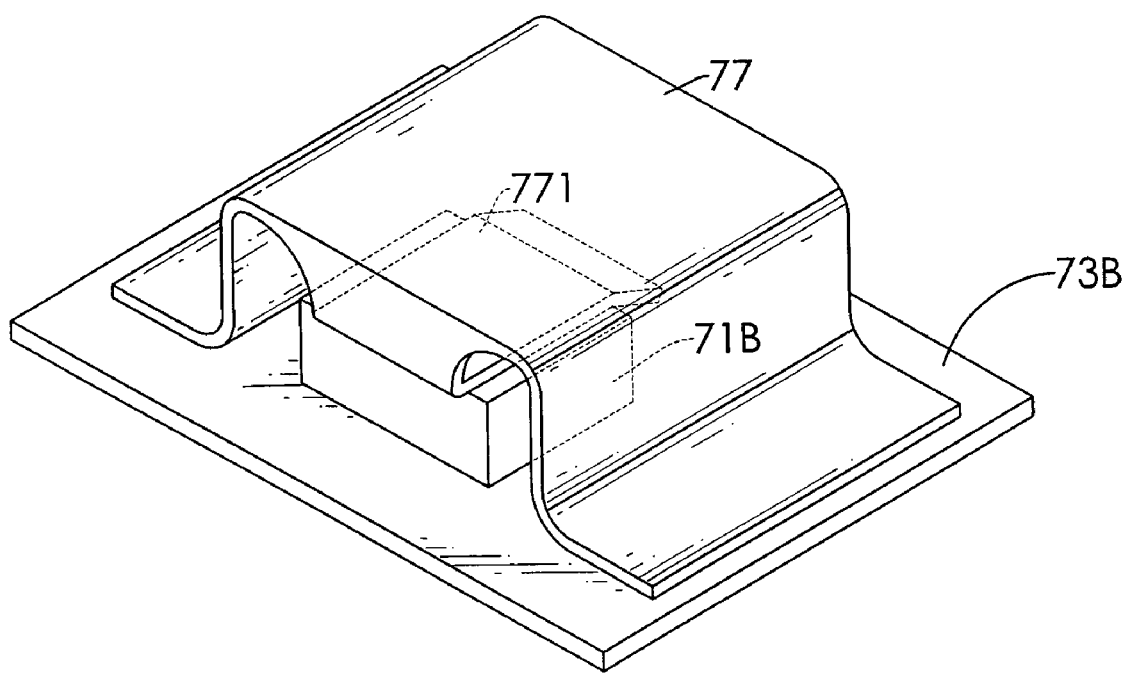
FIG. 15 is an exploded perspective view of still another conventional mounting device in accordance with the prior art, which uses a clamp.

With further reference to FIGS. 3 and 5, the at least one clamp (40, 40A, 40B, 40C, 40D, 40E, 40F) is U-shaped, is mounted across the at least one conductive side (101, 101E) of the heat sink (10, 10A, 10B, 10C, 10D, 10E, 10F) to press the chip units (30) against the heat sink (10, 10A, 10B, 10C, 10D, 10E, 10F). Each clamp (40, 40A, 40B, 40C, 40D, 40E, 40F) has two ends, a middle sheet (401), multiple pressing tabs (41), an optional strengthening covering (60) and two connecting arms (42, 42A, 42B, 42C, 42D, 42E, 42F).

The two ends of the clamp (40, 40A, 40B, 40C, 40D, 40E, 40F) are bent, respectively correspond to and are mounted respectively tightly on the ends of the heat sink (10, 10A, 10B, 10C, 10D, 10E, 10F) to provide a pressing force for the clamp (40, 40A, 40B, 40C, 40D, 40E, 40F).

The middle sheet (401) is parallel to the corresponding conductive side (101, 101E) of the heat sink (10, 10A, 10B, 10C, 10D, 10B, 10F), is formed between the ends of the clamp (40, 40A, 40B, 40C, 40D, 40E, 40F) and has two side edges, a central part and two distal parts. The middle sheet (401G) of the clamp (40G) may be bent to dispose the central part of the middle sheet (401G) closer to the heat sink (10) than the distal parts to strengthen the pressing force against the chip units (30) arranged intermediately.

The pressing tabs (41) extend separately from and arranged in a row on the middle sheet (401, 401G) of the clamp (40, 40A, 40B, 40C, 40D, 40E, 40F, 40G), respectively correspond to and press on the chip units (30) to securely mount the chip units (30) against the conductive side (101, 101E) of the heat sink (10, 10A, 10B, 10C, 10D, 10E, 10F), may be resilient and may be formed by cutting and bending the middle sheet (401G).

The strengthening covering (60) is attached to the middle sheet of the clamp (40). The strengthening covering (60) may be formed on the middle sheet (401) of the clamp (40) by extending the side edges of the middle sheet (401) and folding the side edges to cover upon the middle sheet, or may be mounted on the middle sheet (401) of the clamp (40).

The connecting arms (42, 42A, 42B, 42C, 42D, 42E, 42F) are formed respectively on the ends of the at least one clamp (40, 40A, 40B, 40C, 40D, 40E, 40F), are fastened respectively on the connecting bases (11, 11A, 11B, 11C, 11D, 11E, 11F). Each connecting arm (42, 42A, 42B, 42C, 42D, 42E, 42F) may have a fastening hole (421, 421C, 421E), a U-shaped fastening hook (422A, 422F) or an L-shaped fastening hook (422B, 422D).

The fastening hole (421, 421C, 421E) is formed transversely through the connecting arm (42, 42C, 42E), such that the connecting arm (42, 42C, 42E) may be mounted securely around the corresponding connecting tab (111, 111E) on the connecting base (11, 11E) or may be mounted securely around the corresponding connecting hook (113 C) to fasten the chip units (30) securely on the heat sink (10, 10C, 10E).

The U-shaped fastening hook (422A, 422F) is formed on the connecting arm (42A, 42F) and extends through the corresponding connecting hole (112A, 112F). When the mounting device has one clamp (40A), each U-shaped fastening hook (422A) hooks on the heat sink (10A) to fasten the chip units (30) securely on the heat sink (10A). When the mounting device has two clamps (40F), each U-shaped fastening hook (422F) of one clamp (40F) hooks on the corresponding U-shaped fastening hook (422F) of the other clamp (40F) to fasten the chip units (30) securely on the heat sink (10F).

The L-shaped fastening hook (422B, 422D) is formed on the connecting arm (42B, 42D), may extend through the corresponding connecting hole (112B) and hook on the heat sink (10B), or may extend through the inserting hole (115D) in the corresponding connecting protrusion (114D) and hook in the corresponding connecting protrusion (114D) to fasten the chip units (30) securely on the heat sink (10B, 10D).

Consequently, the mounting device for chips in accordance with the present invention provides an easy and cheap way to securely mount multiple chips on a heat sink (10, 10A, 10B, 10C, 10D, 10E, 10F) at the same time.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A mounting device for chips comprising
a heat sink having
   a conductive side;
   two ends;
   multiple chip units being arranged longitudinally in a row on the conductive side, each chip unit having multiple leads extending transversely; and
   two connecting bases, each connecting base being formed on or near one of the ends of the heat sink; and
a clamp being mounted longitudinally across the conductive side of the heat sink, the clamp having
   two longitudinal ends being bent, each longitudinal end of the clamp corresponding to and being mounted tightly on one of the ends of the heat sink;
   a middle sheet which is parallel to the conductive side of the heat sink, is formed between the longitudinal ends of the clamp, is mounted longitudinally across the chip units and has two side edges;
   multiple pressing tabs extending separately from and being arranged in a row on the middle sheet of the clamp, each pressing tab corresponding to and pressing on one of the chip units; and
   two connecting arms, each connecting arm being formed on one of the longitudinal ends of the clamp and being fastened on one of the connecting bases.

2. The mounting device as claimed in claim 1, wherein the pressing tabs of the clamp are resilient and are formed by cutting and bending the middle sheet of the clamp.

3. The mounting device as claimed in claim 1, wherein the middle sheet of the clamp has a central part and two distal parts and is bent to dispose the central part closer to the heat sink than the distal parts.

4. The mounting device as claimed in claim 1, wherein the clamp further has a strengthening covering being attached to the middle sheet of the clamp.

5. The mounting device as claimed in claim 4, wherein the strengthening covering of the clamp is formed by extending the side edges of the middle sheet of the clamp and folding the side edges to cover upon the middle sheet of the clamp.

6. The mounting device as claimed in claim 4, wherein the strengthening covering of the clamp is mounted on the middle sheet of the clamp.

7. The mounting device as claimed in claim 1, wherein the heat sink further has an insulation spacer being attached to the conductive side of the heat sink.

8. The mounting device as claimed in claim 1, wherein
each connecting base further has a connecting tab extending longitudinally from one of the ends of the heat sink; and
each connecting arm further has a fastening hole being formed through the connecting arm and being mounted securely around the connecting tab of one of the connecting base.

9. The mounting device as claimed in claim 1, wherein
each connecting base further has a connecting hole being formed transversely through a corresponding end of the heat sink; and
each connecting arm further has a U-shaped fastening hook being mounted through a corresponding connecting hole and hooking on the heat sink.

10. The mounting device as claimed in claim 1, wherein
each connecting base further has a connecting hole being formed transversely through a corresponding end of the heat sink; and
each connecting arm further has an L-shaped fastening hook being mounted through a connecting hole and hooking on the heat sink.

11. The mounting device as claimed in claim 1, wherein
each connecting base further has a connecting hook being formed transversely on the conductive side near a corresponding end of the heat sink; and
each connecting arm further has a fastening hole being formed transversely through the connecting arm and being mounted securely around a corresponding connecting hook.

12. The mounting device as claimed in claim 1, wherein
each connecting base further has a connecting protrusion extending transversely from the conductive side of the heat sink adjacent to a corresponding end of the heat sink, the connecting protrusion having an inserting hole being formed longitudinally therethrough; and
each connecting arm further has an L-shaped fastening hook extending through the inserting hole in a corresponding connecting protrusion and hooking in the corresponding connecting protrusion.

13. The mounting device as claimed in claim 8, wherein
the heat sink has two conductive sides; and
each connecting base has two connecting tabs respectively flushing with the conductive sides of the heat sink.

14. The mounting device as claimed in claim 1, wherein
the mounting device has two clamps;
the heat sink has two conductive sides;
each connecting base further has a connecting hole being formed transversely through a corresponding end of the heat sink; and
each connecting arm further has a fastening hook being U-shaped, wherein each fastening hook of one of the clamps extending through the connecting hole and hooking on a corresponding U-shaped fastening hook of the other clamp.

15. The mounting device as claimed in claim 1, wherein the clamp is U-shaped.

* * * * *